United States Patent
Sato et al.

(10) Patent No.: US 8,653,900 B2
(45) Date of Patent: Feb. 18, 2014

(54) OSCILLATOR

(75) Inventors: Kenichi Sato, Tokyo (JP); Tomoaki Yamamoto, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 2 days.

(21) Appl. No.: 12/921,668

(22) PCT Filed: Mar. 13, 2009

(86) PCT No.: PCT/JP2009/054868
§ 371 (c)(1), (2), (4) Date: Sep. 9, 2010

(87) PCT Pub. No.: WO2009/113657
PCT Pub. Date: Sep. 17, 2009

(65) Prior Publication Data
US 2011/0037526 A1     Feb. 17, 2011

(30) Foreign Application Priority Data

Mar. 13, 2008   (JP) .................................. 2008-064247

(51) Int. Cl.
*H03B 5/36*         (2006.01)
(52) U.S. Cl.
USPC .................. 331/158; 331/116 R; 331/116 FE; 333/213; 333/214
(58) Field of Classification Search
USPC .......... 331/74, 158, 116 R, 116 FE; 333/213, 333/214
See application file for complete search history.

(56) References Cited

U.S. PATENT DOCUMENTS

| | | | |
|---|---|---|---|
| 3,025,476 A | 3/1962 | Foung | |
| 6,025,765 A | 2/2000 | Brown | |
| 6,956,442 B2 * | 10/2005 | Groen et al. | 331/57 |
| 2002/0125962 A1 | 9/2002 | Scott | |
| 2005/0083140 A1 | 4/2005 | Hashimoto | |
| 2006/0158267 A1 | 7/2006 | McCorquodale et al. | |

FOREIGN PATENT DOCUMENTS

| | | |
|---|---|---|
| EP | 1517435 A2 | 3/2005 |
| JP | 55-013590 | 1/1980 |
| JP | 55-064406 | 5/1980 |
| JP | 57081707 A | 5/1982 |
| JP | 62-029304 | 2/1987 |
| JP | 3-53706 | 3/1991 |
| JP | 04-267607 | 9/1992 |
| JP | 5-3418 | 1/1993 |
| JP | 2000-216633 | 8/2000 |

(Continued)

OTHER PUBLICATIONS

European Search Report dated Nov. 20, 2012, issued in European Patent Application No. 09720297.2.

*Primary Examiner* — Arnold Kinkead
(74) *Attorney, Agent, or Firm* — Morgan, Lewis & Bockius LLP

(57) ABSTRACT

There is provided an oscillator using a high-frequency crystal resonator which can satisfy the drive level needed for the crystal resonator and expand a variable frequency range. An oscillator having an oscillation circuit CC for oscillating the resonator SS is provided with a limiter circuit LM1 as a load of the resonator SS which is inductive and is a load circuit for limiting an oscillation amplitude. According to this configuration, the action of the limiter circuit LM1 allows satisfaction of the drive level needed for the crystal resonator and expansion of the variable frequency range.

12 Claims, 13 Drawing Sheets

(56) References Cited

FOREIGN PATENT DOCUMENTS

| JP | 2003-037479 A | 2/2003 |
| JP | 2005-051350 A | 2/2005 |
| JP | 2005-136961 | 5/2005 |

* cited by examiner

FIG. 4A     FIG. 4B     FIG. 4C
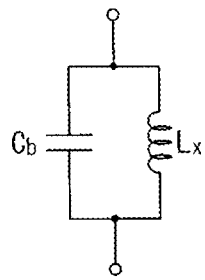 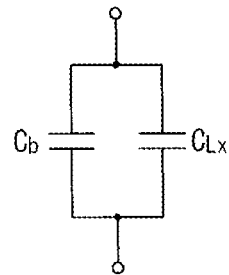 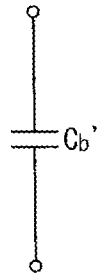
FIG. 5
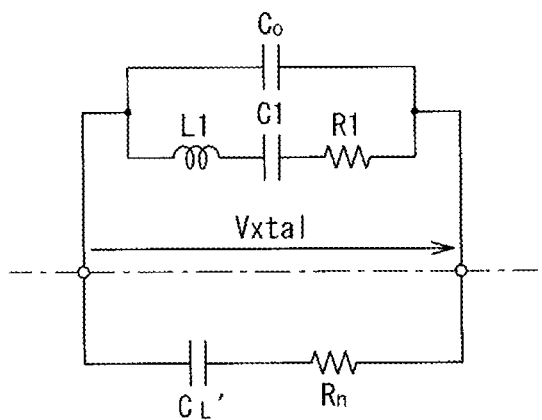

OSCILLATOR

This application claims priority to Japanese Patent Application No. 2008-064247, filed on Mar. 13, 2008, the contents of which are hereby incorporated by reference.

TECHNICAL FIELD

The present invention relates to an oscillator and, more particularly, to an oscillator including an oscillation circuit for oscillating a resonator.

BACKGROUND ART

Along with a recent increase in communication speed and terminal processing speed, there has been a need to raise the frequency of a reference oscillator. A voltage-controlled crystal oscillator using a high-frequency crystal resonator is strongly desired to reduce the drive level (the excitation level) of the crystal resonator.

FIG. 16 is a diagram showing the configuration of a general crystal oscillator. Referring to FIG. 16, a crystal oscillator comprises a crystal resonator SS and an oscillation circuit section CC for oscillating the crystal resonator SS. The oscillation circuit section CC includes an amplifier A and a resistor R which are connected in parallel to the crystal resonator SS, a load capacitive element Ca (with a capacitance value $C_{Ca}$) which is connected between the input side of the amplifier A and the ground, and a load capacitive element Cb (with a capacitance value $C_{Cb}$) which is connected between the output side of the amplifier A and the ground. The resistor R is also called a feedback resistor and is intended to define input and output DC operating points.

If the load capacitive element Ca and the load capacitive element Cb in this configuration are both variable capacitive elements, the oscillation frequency can be controlled. Here, let gm be the amplification factor of the amplifier A and Vxtal be the crystal voltage amplitude of the crystal resonator SS.

The configuration in FIG. 16 is represented as an equivalent circuit in FIG. 17. In FIG. 17, a crystal resonator side SSS is configured such that a crystal equivalent series capacitive component C1 (with a capacitance value $C_{C1}$), a crystal equivalent series resistive component R1 (with a resistance value $R_{R1}$), and a crystal equivalent series inductive component L1 (with a reactance value $L_{L1}$) are connected in parallel to an inter-crystal-terminal capacitance C0 (with a capacitance value $C_{C0}$). On the other hand, an oscillation circuit section side CCS is configured such that a resistive component Rn (with a resistance value $R_{Rn}$) and a capacitive component CL (with a capacitance value $C_{CL}$) are series-connected. The resistive component Rn is a negative resistive component with a minus value. The resistance value $R_{Rn}$ of the negative resistive component Rn counteracts the resistance value $R_{R1}$ of the resistive component R1, which allows provision of a well-known LC oscillator.

Note that the capacitive component CL is an oscillator equivalent capacitive component of the equivalent circuit. The relationship between the capacitance value $C_{CL}$ of the capacitive component CL and the capacitance values $C_{Ca}$ and $C_{Cb}$ of the load capacitive elements Ca and Cb is given by expression (1):

$$C_{CL}=(C_{Ca}\times C_{Cb})/(C_{Ca}+C_{Cb}) \quad (1)$$

According to expression (2), the drive level P is directly proportional to the square of a frequency f. For this reason, if a crystal resonator operating in a high frequency band is used as the crystal resonator, the drive level P has a large value. The resistance value $R_{Rn}$ of the negative resistive component Rn indicating the margin for oscillation of the circuit is given by expression (3):

$$R_{Rn}=gm/\{C_{Ca}\times C_{Cb}\times(2\pi f)^2\} \quad (3)$$

Referring to expression (3), the resistance value $R_{Rn}$ of the negative resistive component Rn is inversely proportional to the square of the frequency. The absolute value of the resistance value $R_{Rn}$ decreases with an increase in the frequency f. In normal design, an amplification factor gm is increased in order to increase the negative resistance. If the amplification factor gm is increased, a crystal voltage amplitude Vxtal generally increases to a power supply level, and the drive level P of the crystal resonator increases. The increased drive level P causes a problem such as shorter life of the crystal resonator.

In the case of a voltage-controlled crystal oscillator, an increased amplification factor gm makes it difficult to expand a variable oscillation frequency range. This point will be described below.

A voltage-controlled crystal oscillator is configured as shown in, e.g., FIG. 18. In FIG. 18, a load capacitive element Ca and a load capacitive element Cb are both variable capacitive elements. Controlling the capacitance of each variable capacitive element by a control voltage allows provision of a well-known voltage-controlled oscillator. More specifically, the capacitances are increased to lower the frequency and are reduced to raise the frequency. Note that, in FIG. 18, the load capacitive element Ca and the load capacitive element Cb each have a parasitic capacitance connected in parallel thereto (a dashed portion in FIG. 18).

An equivalent circuit of the configuration in FIG. 18 is as shown in FIG. 19. In FIG. 19, a capacitive component CL is an oscillator equivalent capacitive component of the equivalent circuit. The relationship between a capacitance value $C_{CL}$ of the oscillator equivalent capacitive component and an oscillation frequency f is given by expression (4):

$$f=\tfrac{1}{2\pi}\{L_{L1}\times C_{C1}\times(C_{C0}+C_{CL})/(C_{C0}+C_{C1}+C_{CL})\}^{1/2} \quad (4)$$

For the sake of simplicity, let fL be a quantity that is a representation of the oscillation frequency f as a ratio. The quantity fL is given by expression (5):

$$fL=(f-fs)/fs \quad (5)$$

In expression (5), a frequency fs is a series resonance frequency of a crystal resonator SS and is given by $fs=\tfrac{1}{2\pi}(L_{L1}\times C_{C1})^{1/2}$.

Substitution of the oscillation frequency f and the series resonance frequency fs into expression (5) and approximation of the substitution result yield expression (6):

$$\begin{aligned}fL &= [1/2\pi\{L_{L1}\cdot C_{C1}\cdot(C_{C0}+C_{CL})/(C_{C0}+C_{C1}+C_{CL})\}^{1/2} - \\ &\quad 1/2\pi(L_{L1}\cdot C_{C1})^{1/2}]/\{1/2\pi(L_{L1}\cdot C_{C1})\} \\ &= \{C_{C1}/(C_{C0}+C_{CL})+1\}^{1/2}-1 \text{ since often } C_{C1}<<(C_{C0}+C_{CL}) \\ &\approx 1/2\cdot\{C_{C1}/(C_{C0}+C_{CL})\}\end{aligned} \quad (6)$$

The variable frequency range when the capacitance of the parasitic capacitances and the like excluding a variable capacitance is small will be compared with that when the capacitance is large.

FIG. 20 is a graph showing a change in the quantity fL that is a representation as a ratio of the oscillation frequency f with respect to the capacitance value $C_{CL}$ of the oscillator equivalent capacitive component CL.

Referring to FIG. 20, if the value of the capacitance of the oscillator equivalent capacitive component CL excluding the variable capacitance is small, the capacitance value $C_{CL}$ is also small, as seen from expression (1). The variable frequency range in this case is $\Delta fL1$ in FIG. 20. On the other hand, if the value is large, the capacitance value $C_{CL}$ is also large, as seen from expression (1). The variable frequency range in this case is $\Delta fL2$ in FIG. 20. That is, even if variable ranges $\Delta C_{CL}$ of the capacitance value $C_{CL}$ of the oscillator equivalent capacitive component CL are equal, the variable frequency range is wider when the value of the capacitance excluding the variable capacitance is smaller. For this reason, expansion of the variable frequency range is difficult when the value of the capacitance excluding the variable capacitance is large.

In a high frequency band, an amplification factor gm is generally increased in order to increase a resistance value $R_{Rn}$ of a negative resistive component of the circuit. The increase in the amplification factor gm requires an amplifier to be of a larger size, resulting in the higher capacitance of the parasitic capacitances. This makes it difficult to expand the variable oscillation frequency range.

A configuration for solving the above-described problems associated with a drive level P of a crystal resonator and a variable frequency range at high frequencies has been disclosed (see, e.g., JP2001-308641A). The configuration will be described with reference to FIG. 21.

FIG. 21 is an example of a general method for keeping a crystal voltage amplitude Vxtal down. The example is configured such that a diode D1 is connected to keep a crystal voltage amplitude Vxtal down. In the configuration in FIG. 21, an anode of the diode D1 is connected to an output end whereas a cathode of the diode D1 is connected to the ground.

In the circuit configuration in FIG. 21, since the crystal voltage amplitude Vxtal is determined by a forward voltage drop of the diode D1 connected as a clamp diode, the crystal voltage amplitude Vxtal can be reduced. Here, let Vf be the forward voltage drop of the diode D1. The crystal voltage amplitude Vxtal is given by expression (7):

$$Vxtal=(1/\sqrt{2}) \times Vf \qquad (7)$$

As can be seen from expressions (2) and (7), a drive level P of a crystal resonator can be reduced. Note that the forward voltage drop Vf of the diode D1 is, for example, 0.8 [V].

DISCLOSURE OF THE INVENTION

Problems to be Solved by the Invention

In the configuration in FIG. 21 as well, the drive level P of the crystal resonator can be expressed by expression (2) above. However, the configuration in FIG. 21 is such that a junction capacitance $C_{D1}$ for the diode (a dashed portion in FIG. 21) is connected in parallel to a load capacitive element Cb and suffers from a problem in that its load capacitance increases by an amount corresponding to the junction capacitance. That is, even if the drive level P of the crystal resonator is improved in terms of amplitude, it is degraded due to an increase in an oscillator equivalent capacitive component CL of the circuit resulting from the increased load capacitance. Accordingly, the configuration is less effective in terms of drive level P.

Referring to FIG. 20, since a capacitance value $C_{CL}$ of the oscillator equivalent capacitive component CL of the circuit increases, it is difficult to achieve a wide variable frequency range.

The present invention has been made in order to solve the problems of the prior art described above, and has as its object to provide an oscillator using a high-frequency crystal resonator which can satisfy the drive level needed for the crystal resonator and expand a variable frequency range.

Means for Solving the Problems

An oscillator according to the present invention is an oscillator having an oscillation circuit for oscillating a resonator, characterized by comprising, as a load of the resonator, a load circuit which is inductive and limits an oscillation amplitude. This configuration allows satisfaction of the drive level needed for the resonator and expansion of a variable frequency range.

The load circuit may include at least one active element. Even if the load circuit includes at least one active element, satisfaction of the drive level needed for the resonator and expansion of the variable frequency range can be achieved.

For example, the active element is a transistor. Limitation of the oscillation amplitude is implemented by a threshold voltage for the transistor. A reactance component of an output impedance of the load circuit is positive. This configuration allows satisfaction of the drive level needed for the crystal resonator and expansion of the variable frequency range.

The load circuit is connected to at least one terminal of the resonator. The connection of the load circuit to at least one terminal of the resonator allows regulation of a change in voltage and satisfaction of the drive level needed for the crystal resonator.

The load circuit is connected in parallel to the resonator. Even if the load circuit is connected in parallel to the resonator, regulation of a change in voltage allows satisfaction of the drive level needed for the crystal resonator.

The load circuit is characterized by including:

an NPN bipolar transistor having an emitter connected to a terminal of the resonator and a collector to which a first predetermined voltage is supplied;

a resistive component having one end to which a second predetermined voltage is supplied and the other end connected to a base of the NPN bipolar transistor; and a capacitive component provided between the emitter and the base of the NPN bipolar transistor. Use of the load circuit allows satisfaction of the drive level needed for the crystal resonator and expansion of the variable frequency range.

The load circuit is characterized by including:

an NPN bipolar transistor having a collector connected to a terminal of the resonator and an emitter to which a third predetermined voltage is supplied;

a resistive component provided between the collector and a base of the NPN bipolar transistor; and a capacitive component provided between the emitter and the base of the NPN bipolar transistor. Use of the load circuit allows satisfaction of the drive level needed for the crystal resonator and expansion of the variable frequency range.

The load circuit may include a PNP bipolar transistor having an emitter connected to the resonator and a collector to which a first predetermined voltage is supplied, a resistive component having one end to which a second predetermined voltage is supplied and the other end connected to a base of the PNP bipolar transistor, and a capacitive component provided between the emitter and the base of the PNP bipolar transistor. Use of the load circuit allows satisfaction of the drive level needed for the crystal resonator and expansion of the variable frequency range.

The load circuit may include a PNP bipolar transistor having a collector connected to the resonator and an emitter to which a third predetermined voltage is supplied, a resistive component provided between the collector and a base of the PNP bipolar transistor, and a capacitive component provided between the emitter and the base of the PNP bipolar transistor. Use of the load circuit allows satisfaction of the drive level needed for the crystal resonator and expansion of the variable frequency range.

The load circuit is characterized by including:

a MOS transistor having a drain connected to the resonator and a source to which a fourth predetermined voltage is supplied;

a resistive component provided between the drain and a gate of the MOS transistor; and a capacitive component provided between the source and the gate of the MOS transistor. The MOS transistor may be an N-type MOS transistor. Alternatively, the MOS transistor may be a P-type MOS transistor. Use of the load circuit allows satisfaction of the drive level needed for the crystal resonator and expansion of the variable frequency range.

The load circuit is characterized by including:

a MOS transistor having a source connected to the resonator and a drain to which a fifth predetermined voltage is supplied;

a resistive component having one end to which a sixth predetermined voltage is supplied and the other end connected to a gate of the MOS transistor; and a capacitive component provided between the source and the gate of the MOS transistor. The MOS transistor may be an N-type MOS transistor. Alternatively, the MOS transistor may be a P-type MOS transistor. Use of the load circuit allows satisfaction of the drive level needed for the crystal resonator and expansion of the variable frequency range.

As the load circuit, two of the above-described load circuits may be provided in combination. The provision of the two circuits in combination allows regulation of the upper and lower limits for a varying voltage and satisfaction of the drive level needed for the crystal resonator.

Advantages of the Invention

According to the present invention, inclusion of a circuit which is inductive and limits an oscillation amplitude as a load of a crystal resonator allows satisfaction of the drive level needed for the resonator and expansion of a variable frequency range.

BRIEF DESCRIPTION OF THE DRAWINGS

FIGS. 4 are diagrams each showing an equivalent circuit of a dashed portion in FIG. 3;

FIG. 5 is a diagram showing an equivalent circuit of the configuration in FIG. 3;

BEST MODE FOR CARRYING OUT THE INVENTION

Figure 1:
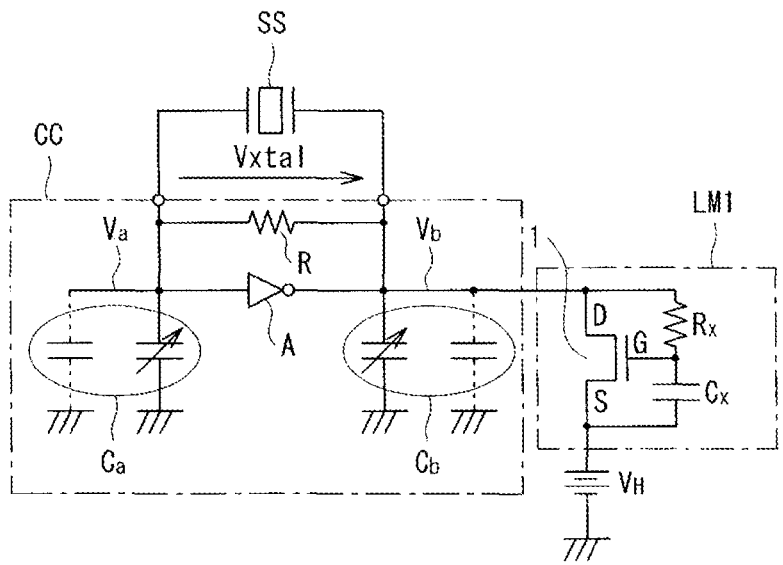
FIG. 1 is a circuit diagram showing the configuration of an oscillator according to a first embodiment of the present invention.

Embodiments of the present invention will be described below with reference to the drawings. Note that, in each of the drawings referred to in the description below, the same components as the other drawings are denoted by the same reference numerals.

(First Embodiment)

FIG. 1 is a circuit diagram showing the configuration of an oscillator according to an embodiment of the present invention. In FIG. 1, the oscillator according to this embodiment is configured such that a limiter circuit LM1 is connected as a load circuit of the oscillator which comprises a crystal resonator SS and an oscillation circuit section CC for oscillating the crystal resonator SS.

The following description will be given in the context of a crystal resonator. However, the resonator to be used is not limited to a crystal resonator. A SAW resonator, a ceramic resonator, or the like may be used instead.

Focus attention on the limiter circuit LM1 in FIG. 1. Electric current caused by oscillation from one terminal of the crystal resonator passes through the limiter circuit LM1 and returns to the other terminal of the crystal resonator via a voltage source (with a voltage value VH). The limiter circuit LM1 is thus a load of the crystal resonator.

The limiter circuit LM1 comprises an N-type MOS transistor 1, a resistive element Rx (with a resistance value $R_{Rx}$) which is connected between a gate terminal G and a drain terminal D of the N-type MOS transistor 1, and a capacitive element Cx (with a capacitance value $C_{Cx}$) which is connected between the gate terminal G and a source terminal S of the N-type MOS transistor 1. The drain terminal D of the N-type MOS transistor 1 is connected to an output terminal of an amplifier A. Note that the source terminal S of the N-type MOS transistor 1 connects to the voltage source with the voltage value VH.

Figure 2:
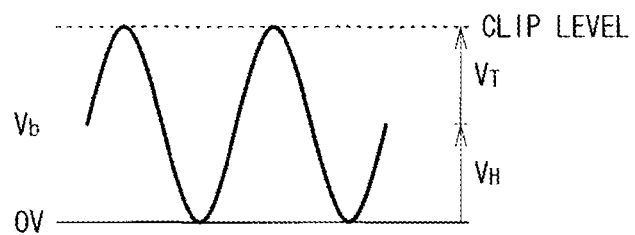
FIG. 2 is a graph showing a change in the voltage at an output terminal in FIG. 1.

A voltage Vb at the output terminal of the amplifier A is clipped by the limiter circuit LM1 when it exceeds a threshold voltage value for the gate voltage of the N-type MOS transistor 1. That is, the voltage Vb is clipped at a voltage value which is obtained by adding a threshold voltage value VT for the N-type MOS transistor 1 to the voltage value VH of the voltage source, as shown in FIG. 2.

Since a voltage Va at an input terminal of the amplifier is approximately 180° out of phase with and at the same level as the voltage Vb at the output terminal, a crystal voltage amplitude Vxtal is given by expression (8):

$$Vxtal=(1/\sqrt{2})\times(VT+VH) \qquad (8)$$

Adjustment of the voltage value VH of the voltage source allows adjustment of the crystal voltage amplitude Vxtal. That is, the crystal voltage amplitude Vxtal can be kept down by adjusting the value VH of a voltage supplied to the source terminal S of the N-type MOS transistor 1.

Figure 3:
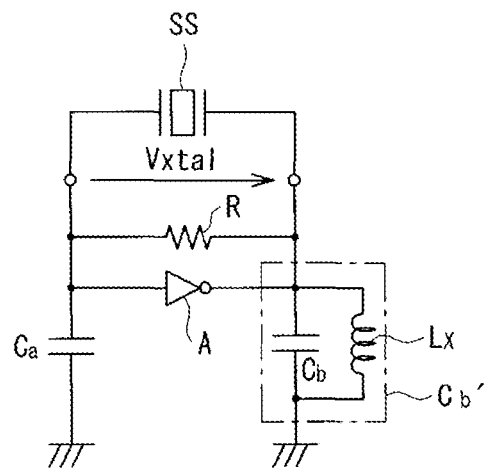
FIG. 3 is a diagram showing an equivalent circuit of the configuration in FIG. 1.

In order to check the drive level of the crystal resonator, a diagram of an equivalent circuit of the configuration in FIG. 1 is drawn as shown in FIG. 3. In FIG. 3, the portion of the limiter circuit LM1 in FIG. 1 can be represented as an inductance Lx. Letting gmx be the amplification factor of the N-type MOS transistor 1, a value $L_{Lx}$ of the inductance Lx is given by:

$$L_{Lx}=(gmx \cdot R_{Rx}-1) \cdot C_{Cx}/\{gmx^2+(2\pi f)^2 \cdot C_{Cx}^2\} \qquad (9)$$

A parallel circuit composed of the value $L_{Lx}$ of the inductance Lx and a capacitance value $C_{Cb}$ of a load capacitive element Cb will be referred to as a capacitance Cb'.

If the value of a reactance of $2\pi f L_{Lx}$ which is the product of the inductance $L_{Lx}$ and an angular frequency of $2\pi f$ is positive, the inductance Lx appears equivalent to a coil. That is, the reactance of the limiter circuit LM1 is inductive. In expression (9), the condition to be satisfied to make the reactance of the limiter circuit LM1 inductive is $R_{Rx}>(1/gmx)$.

In order to check the equivalent capacitance of the circuit, an equivalent circuit portion (a dashed portion in FIG. 3) composed of the load capacitive element Cb and the limiter circuit LM1 is deformed as shown in FIG. 4. That is, the circuit configuration in FIG. 4(a) corresponding to the dashed portion in FIG. 3 can be replaced with a parallel circuit composed of the load capacitive element Cb and a load capacitive element $C_{Lx}$ (with a capacitance value of $-1/L_{Lx}(2\pi f)^2$), as shown in FIG. 4(b). The circuit in FIG. 4(b) can be further deformed as shown in FIG. 4(c).

In FIG. 4(c), a capacitance value $C_{Cb}'$ of the load capacitive element Cb' is given by:

$$C_{Cb}'=C_{Cb}-\{1/L_{Lx}(2\pi f)^2\} \qquad (10)$$

That is, since the inductance Lx is inserted in parallel to the load capacitive element Cb, the capacitance value $C_{Cb}'$ appears smaller than the capacitance value $C_{Cb}$ of the load capacitive element Cb.

Based on the above description, a capacitance value of an oscillator equivalent capacitive component CL' is represented as shown in FIG. 5. In FIG. 5, a capacitance value $C_{CL}'$ of the oscillator equivalent capacitive component CL' is given by:

$$C_{CL}'=(C_{Ca}\times C_{Cb}')/(C_{Ca}+C_{Cb}') \qquad (11)$$

For this reason, the oscillator equivalent capacitive component CL' with a small capacitance value can be obtained.

A drive level P of the crystal resonator is given by expression (12):

$$P=R_{R1}\times(C_{CL}'+C_{C0})^2\times(2\pi f)^2\times Vxtal^2 [W] \qquad (12)$$

The circuit configuration in FIG. 1 can keep the crystal voltage amplitude Vxtal down and reduce the capacitance value of the oscillator equivalent capacitive component CL', and thus the drive level P can be kept down.

Figure 6:
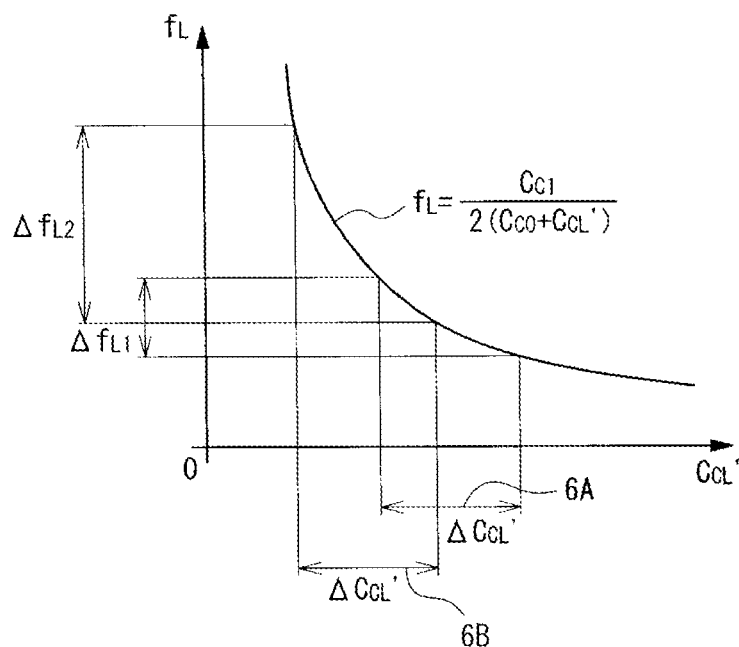
FIG. 6 is a graph showing a variable frequency range in the configuration in FIG. 1.

The capacitance value of the oscillator equivalent capacitive component CL' is reduced, and a variable frequency range is as shown in FIG. 6.

FIG. 6 is a graph showing a change in a quantity fL that is a representation as a ratio of an oscillation frequency f with respect to the capacitance value $C_{CL}'$ of the oscillator equivalent capacitive component CL'.

Referring to FIG. 6, in a circuit configuration without a limiter circuit, the oscillator equivalent capacitive component varies within a range 6A in FIG. 6, and the variable frequency range is a range ΔfL1. In contrast, in the circuit configuration with the limiter circuit LM1 as shown in FIG. 1, the capacitance value $C_{CL}'$ of the oscillator equivalent capacitive component CL' varies within a range 6B in FIG. 6, and the variable frequency range is a range ΔfL2. Although a variable range $\Delta C_{CL}'$ of the capacitance value $C_{CL}'$ remains the same, the range ΔfL2 is wider than the range ΔfL1. Addition of the limiter circuit LM1 allows expansion of the variable frequency range.

Therefore, this embodiment allows an oscillator using a high-frequency crystal resonator SS to satisfy the drive level needed for the crystal resonator and expand a variable frequency range.

(Second Embodiment)

Figure 7:
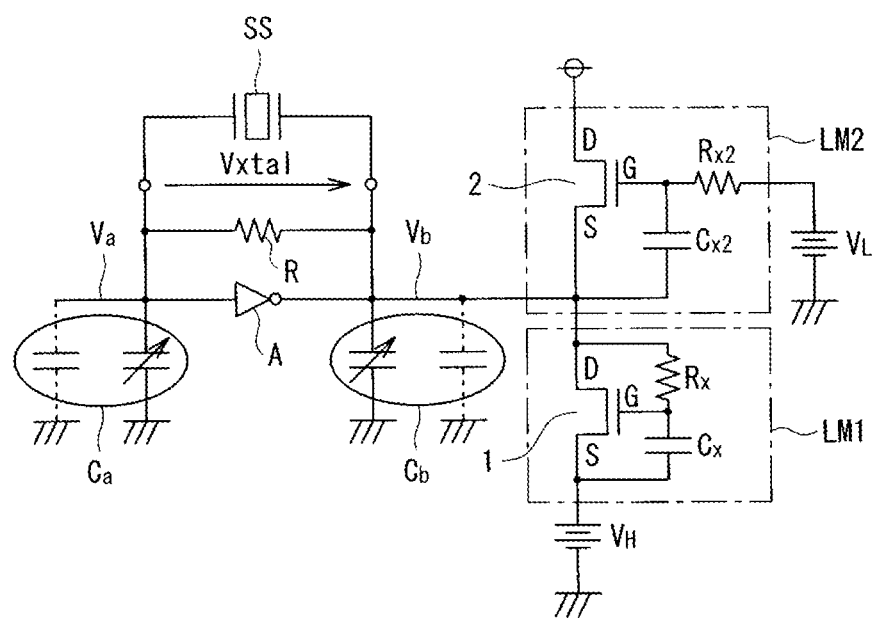
FIG. 7 is a circuit diagram showing the configuration of an oscillator according to a second embodiment of the present invention.

FIG. 7 is a circuit diagram showing the configuration of an oscillator according to a second embodiment of the present invention. The first embodiment described above has a configuration in which a limiter circuit for an upward direction (i.e., a circuit which regulates the upper limit for a varying voltage at the output terminal of the amplifier A when connected to the output terminal is added. In contrast, this embodiment adopts a configuration in which a limiter circuit for a downward direction (i.e., a circuit which regulates the lower limit for a varying voltage at an output terminal of an amplifier A when connected to the output terminal) is further added.

In FIG. 7, a limiter circuit LM1 for the upward direction and a limiter circuit LM2 for the downward direction are connected as loads of the oscillator. The limiter circuit LM2 in this example comprises an N-type MOS transistor 2, a capacitive element Cx2 which is connected between a gate terminal G and a source terminal S of the N-type MOS transistor 2, and a resistive element Rx2 which is connected to the gate terminal G of the N-type MOS transistor 2. The source terminal S of the N-type MOS transistor 2 is connected to the output terminal of the amplifier A. The other end of the resistive element Rx2 connected to the gate terminal G of the N-type MOS transistor 2 connects to a voltage source with a voltage value VL.

Figure 8:
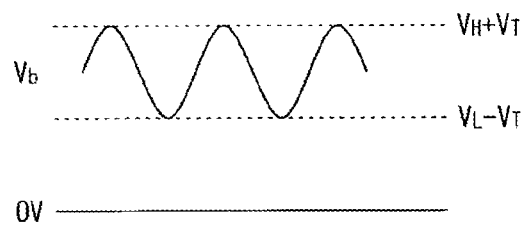
FIG. 8 is a graph showing a change in the voltage at an output terminal in FIG. 7.

Since the limiter circuits for the two upward and downward directions are connected, for the amplitude of a voltage Vb on the output side of the amplifier, the voltage is clipped by the limiter circuits LM1 and LM2 when it exceeds a threshold value for the gate voltage of an N-type MOS transistor 1 or falls below a threshold value for the gate voltage of the N-type MOS transistor 2. That is, as shown in FIG. 8, the upper limit for the voltage Vb is clipped at a voltage value which is obtained by adding a threshold voltage value VT for the N-type MOS transistor 1 to a voltage value VH of a voltage source, and the lower limit is clipped at a voltage value which is obtained by subtracting a threshold voltage value VT for the N-type MOS transistor 2 from the voltage value VL of the voltage source.

In this case, a crystal voltage amplitude Vxtal is given by expression (13):

$$Vxtal=(1/\sqrt{2})\times\{(VH+VT)-(VL-VT)\} \qquad (13)$$

The voltage value VL and the voltage value VH can be arbitrarily set, and the voltage value VH may be 0 V. Adjustment of the value VH of a voltage supplied to a source terminal S of the N-type MOS transistor 1 and adjustment of the value VL of a voltage supplied to the gate terminal G of the N-type MOS transistor 2 via the resistive element Rx2 allows a further reduction in the crystal voltage amplitude Vxtal.

Figure 9A:
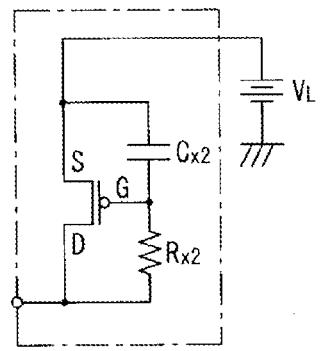
FIG. 9($a$) is a diagram showing a limiter circuit configured with use of a P-type MOS transistor, FIG. 9($b$) is a diagram showing a limiter circuit configured with use of a P-type MOS transistor, FIG. 9($c$) is a diagram showing a limiter circuit configured with use of an NPN-type bipolar transistor, FIG. 9($d$) is a diagram showing a limiter circuit configured with use of an NPN-type bipolar transistor, FIG. 9($e$) is a diagram showing a limiter circuit configured with use of a PNP-type bipolar transistor, and FIG. 9($f$) is a diagram showing a limiter circuit configured with use of a PNP-type bipolar transistor.
Figure 9B:
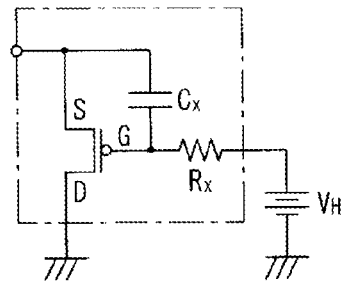

In FIG. 7, the limiter circuits LM1 and LM2 are both configured with use of an N-type MOS transistor, active elements. The limiter circuits may be configured with use of a P-type MOS transistor. FIG. 9(a) shows the limiter circuit LM2 for the downward direction which is configured with use of a P-type MOS transistor whereas FIG. 9(b) shows the limiter circuit LM1 for the upward direction which is configured with use of a P-type MOS transistor. Connection of the limiter circuits to an output end of the oscillator allows the lower limit for the voltage amplitude of a crystal resonator to be kept up and the upper limit to be kept down.

Figure 9C:
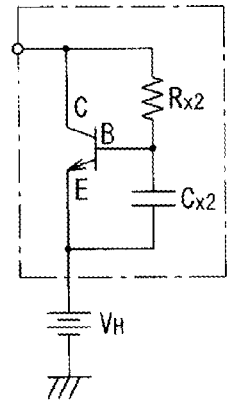
Figure 9D:
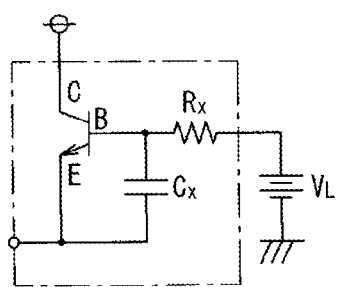

Alternatively, each limiter circuit may be configured with use of another active element, a bipolar transistor. FIG. 9(c) shows the limiter circuit LM1 for the upward direction which is configured with use of an NPN-type bipolar transistor whereas FIG. 9(d) shows the limiter circuit LM2 for the downward direction which is configured with use of an NPN-type bipolar transistor. Connection of the limiter circuits to the output end of the oscillator allows the upper limit for the voltage amplitude of the crystal resonator to be kept down and the lower limit to be kept up.

Figure 9E:
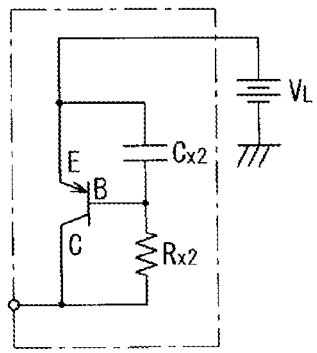
Figure 9F:
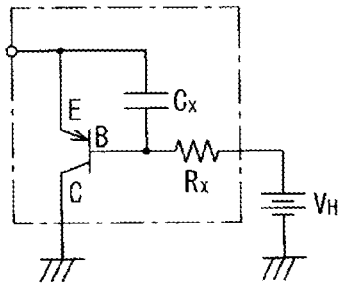

FIG. 9(e) shows the limiter circuit LM2 for the downward direction which is configured with use of a PNP-type bipolar transistor whereas FIG. 9(f) shows the limiter circuit LM1 for the upward direction which is configured with use of a PNP-type bipolar transistor. Connection of the limiter circuits to the output end of the oscillator allows the lower limit for the voltage amplitude of the crystal resonator to be kept up and the upper limit for the voltage amplitude of the crystal resonator to be kept down.

The second embodiment described above has a configuration in which the limiter circuit LM1 for the upward direction and the limiter circuit LM2 for the downward direction are added. However, to clip only the lower limit for the voltage Vb, a configuration provided with only the limiter circuit LM2 for the downward direction may be adopted. In this case, the crystal voltage amplitude Vxtal is given by expression (14):

$$Vxtal=(1/\sqrt{2})\times(VL-VT) \qquad (14)$$

The voltage value VL can be arbitrarily set. Adjustment of the value VL of the voltage supplied to the gate terminal G of the N-type MOS transistor 2 via the resistive element Rx2 allows a further reduction in the crystal voltage amplitude Vxtal.

In FIG. 9(d), a base of the NPN-type bipolar transistor is connected to the voltage source (with the voltage value VL) via a resistive element Rx, and a collector is connected to a positive supply. The collector may be connected to the voltage source (with the voltage value VH) instead of being connected to the positive supply.

Similarly, in FIG. 9(f), a base of the PNP-type bipolar transistor is connected to the voltage source (with the voltage value VH) via the resistive element Rx, and a collector is grounded. The collector may be connected to the voltage source (with the voltage value VH) instead of being grounded.

In FIG. 9(b), a gate of the P-type MOS transistor is connected to the voltage source (with the voltage value VH) via the resistive element Rx, and a drain is grounded. The drain may be connected to the voltage source (with the voltage value VH) instead of being grounded.

In FIG. 7, the gate of the N-type MOS transistor 2 of the limiter circuit LM2 is connected to the voltage source (with the voltage value VL) via the resistive element Rx2, and a drain is connected to the positive supply. The drain may be connected to the voltage source (with the voltage value VL) instead of being connected to the positive supply.

(Third Embodiment)

Figure 10:
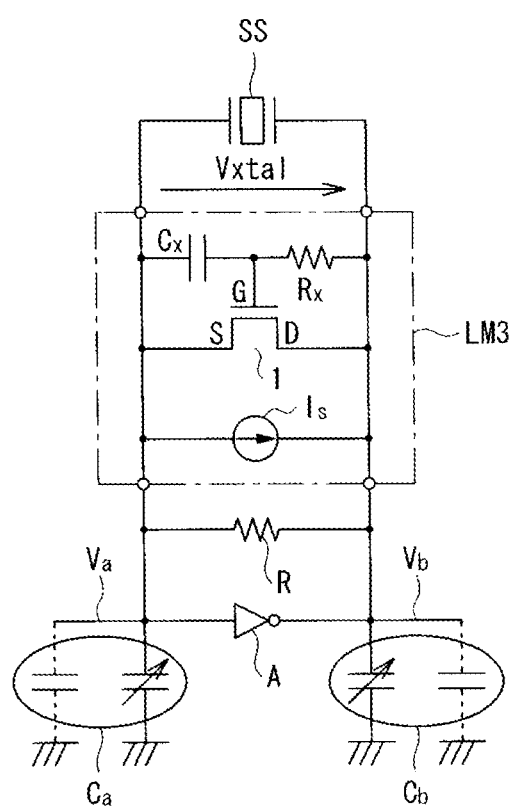
FIG. 10 is a diagram showing an example of the configuration of an oscillator in which a differential limiter circuit is arranged.

A limiter circuit can also be arranged between terminals of a crystal resonator. For example, a differential limiter circuit LM3 may be connected as a limiter circuit for an upward direction between terminals of a crystal resonator SS, as shown in FIG. 10. Note that the potential at a drain terminal of an N-type MOS transistor 1 needs to be DC-biased to be higher than that at a source terminal by a current source Is. For the relationship between a voltage Va and a voltage Vb during oscillation, the action of the voltage Vb starting dropping when the voltage Va starts rising and the action of the voltage Vb starting rising when the voltage Va starts dropping are alternately performed. Assume that a value of the voltage Vb—the voltage Va exceeds a threshold voltage value VT for the N-type MOS transistor when the voltage Va starts dropping, and the voltage Vb starts rising. In this case, electric current flows through the transistor, and a value of the voltage Va—the voltage Vb is limited by a voltage, i.e., the threshold voltage value VT. Accordingly, a crystal voltage amplitude Vxtal can be reduced, compared to a case without the limiter circuit LM3.

Figure 11B:
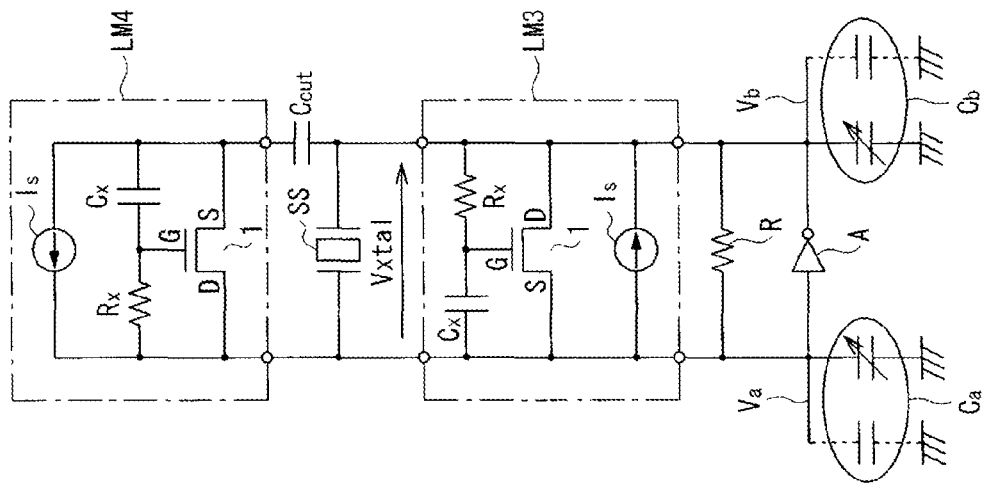
FIG. 11($a$) is a diagram showing an example of the configuration of the oscillator in which another differential limiter circuit is arranged, and FIG. 11($b$) is a diagram showing an example of the configuration of the oscillator in which the two differential limiter circuits are arranged.
Figure 11A:
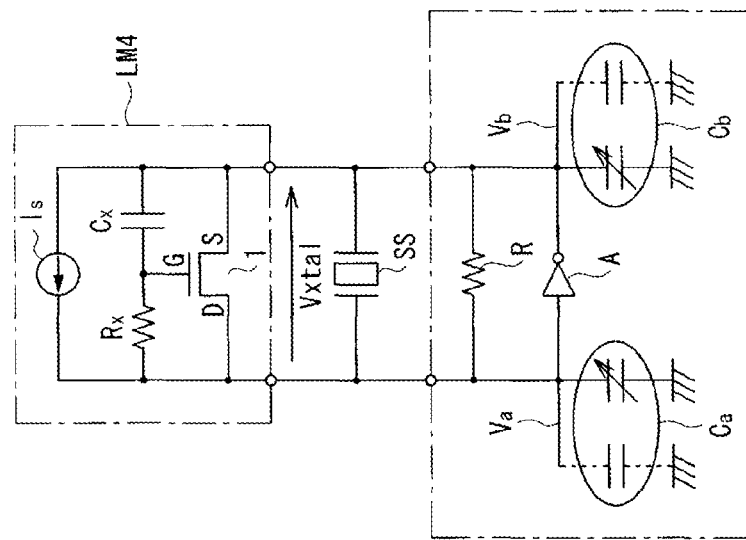

Alternatively, a differential limiter circuit LM4 as shown in FIG. 11(a) may be provided as a limiter circuit for a downward direction. The relationship between the voltage Va and the voltage Vb during oscillation is the same for the circuit configuration in FIG. 11(a). The action of the voltage Vb starting dropping when the voltage Va starts rising and the action of the voltage Vb starting rising when the voltage Va starts dropping are alternately performed. Assume that the value of the voltage Va—the voltage Vb exceeds a threshold voltage value VT for an N-type MOS transistor when the voltage Va starts rising, and the voltage Vb starts dropping. In this case, electric current flows through the transistor, and the value of the voltage Vb—the voltage Va is limited by a voltage, i.e., the threshold voltage value VT. Accordingly, the crystal voltage amplitude Vxtal can be reduced, compared to a case without the limiter circuit LM4.

Alternatively, the two differential limiter circuits LM3 and LM4 may be provided, as shown in FIG. 11(b). Note that this case requires a DC cut capacitor Ccut.

Since the limiter circuits for the two upward and downward directions are connected, for the amplitude of the voltage Vb on the output side of an amplifier, the voltage is clipped by the limiter circuits LM3 and LM4 when it exceeds the threshold value for the gate voltage of the N-type MOS transistor 1 of the limiter circuit LM3 or falls below the threshold value for the gate voltage of the N-type MOS transistor 1 of the limiter circuit LM4. That is, if the value of the voltage Vb—the voltage Va exceeds the threshold voltage value VT for the N-type MOS transistor of the limiter circuit LM3, electric current flows through the N-type MOS transistor, and the voltage is clipped at the threshold voltage value VT. If the value of the voltage Va—the voltage Vb falls below the threshold voltage value VT for the N-type MOS transistor of the limiter circuit LM4, electric current flows through the N-type MOS transistor, and the voltage is clipped at the threshold voltage value VT. Accordingly, the crystal voltage amplitude Vxtal can be further reduced, compared to the cases in FIGS. 10 and 11(a).

In this case, the crystal voltage amplitude Vxtal is given by expression (15):

$$Vxtal = (1/\sqrt{2}) \times 2VT \qquad (15)$$

Figure 12A:
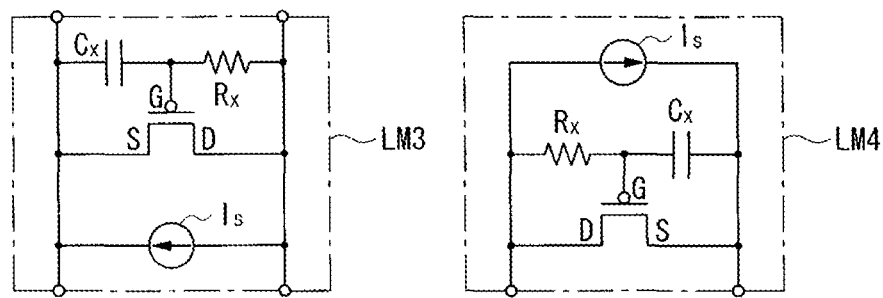
FIGS. 12 are diagrams showing examples of the configuration of the oscillator in which other differential limiter circuits are arranged, in which FIG. 12($a$) is diagrams showing examples of the configurations of limiter circuits with use of P-type MOS transistors, FIG. 12($b$) is diagrams showing examples of the configurations of limiter circuits configured with use of NPN-type bipolar transistors, and FIG. 12($c$) is diagrams showing examples of the configurations of limiter circuits with use of PNP-type bipolar transistors.
Figure 12B:
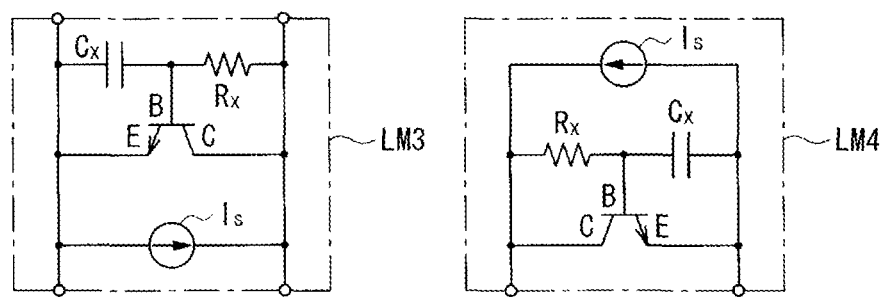
Figure 12C:
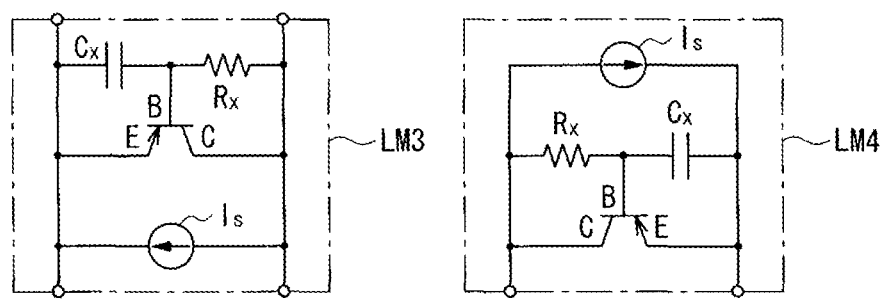

Although each limiter circuit is configured with use of the N-type MOS transistor 1 in each of FIGS. 10, 11(a), and 11(b), it may be configured with use of a P-type MOS transistor, an NPN-type bipolar transistor, or a PNP-type bipolar transistor, as shown in FIGS. 12(a), 12(b), and 12(c). If each limiter circuit is configured with use of a bipolar transistor, a resistive element Rx is connected between a base terminal and a collector terminal of the bipolar transistor, and a capacitive element Cx is connected between the base terminal and an emitter terminal of the bipolar transistor.

(Layout of Limiter Circuit)

Figure 13:
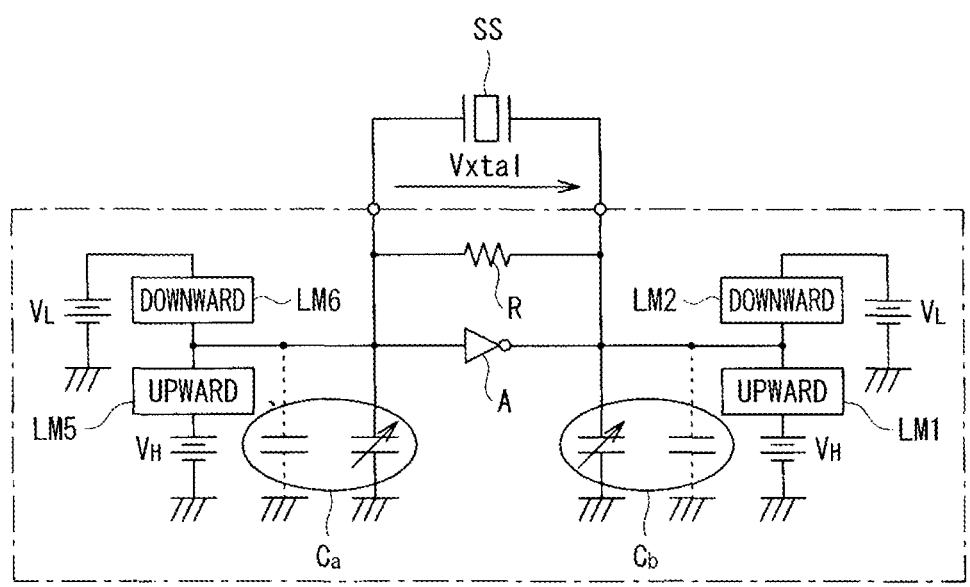
FIG. 13 is a diagram showing an example of the layout of limiter circuits.

The limiter circuits described above may each be provided at any position. More specifically, as shown in FIG. 13, the effect of keeping down the crystal voltage amplitude Vxtal is produced, regardless of whether a limiter circuit is arranged on the input side of an amplifier A or on the output side thereof. In FIG. 13, the word "upward" denotes a limiter circuit for an upper voltage limit whereas the word "downward" denotes a limiter circuit for a lower voltage limit.

If a limiter circuit LM5 for the upper limit for a voltage on the input side of the amplifier A is provided, the lower limit for a voltage on the output side of the amplifier A is generally kept up. If a limiter circuit LM6 for the lower limit for the voltage on the input side of the amplifier A is provided, the upper limit for the voltage on the output side of the amplifier A is generally kept down.

Figure 14A:
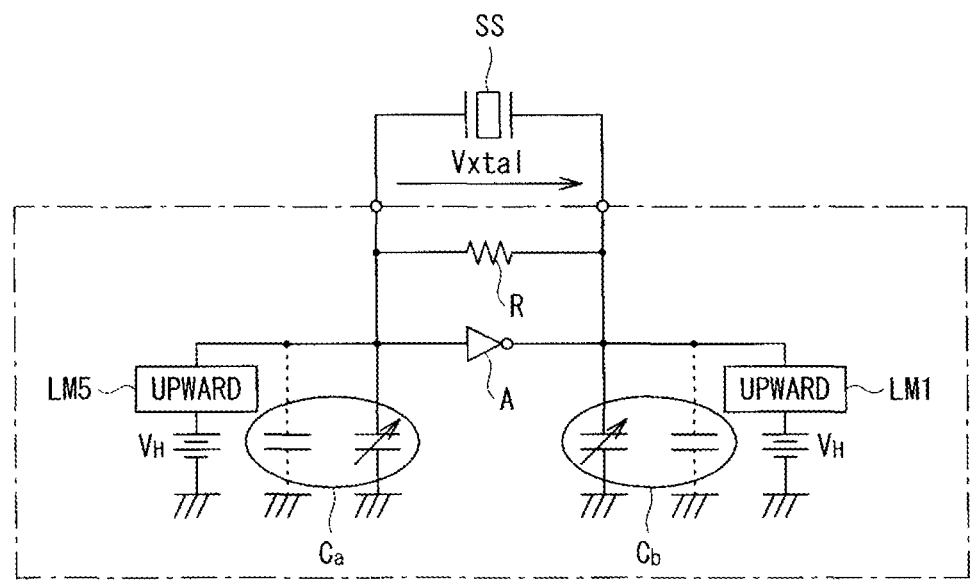
FIG. 14($a$) is a diagram showing a configuration in which a limiter circuit for the upper limit for a voltage on the input side of an amplifier and a limiter circuit for the upper limit for a voltage on the output side of the amplifier are provided, and FIG. 14($b$) is a diagram showing a configuration in which a limiter circuit for the lower limit for the voltage on the input side of the amplifier and a limiter circuit for the lower limit for a voltage on the output side of the amplifier are provided.

Accordingly, a configuration may be adopted in which the limiter circuit LM5 for the upper limit for the voltage on the input side of the amplifier A and the limiter circuit LM1 for the upper limit for the voltage on the output side of the amplifier A are provided, as shown in FIG. 14(a).

Figure 14B:
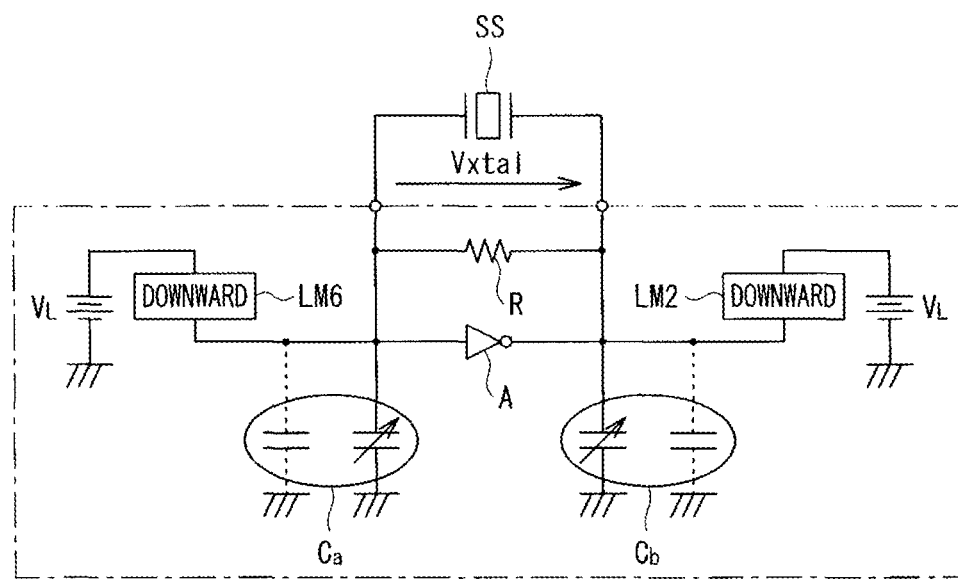

Alternatively, a configuration may be adopted in which the limiter circuit LM6 for the lower limit for the voltage on the input side of the amplifier A and the limiter circuit LM2 for the lower limit for the voltage on the output side of the amplifier A are provided, as shown in FIG. 14(b).

Figure 15A:
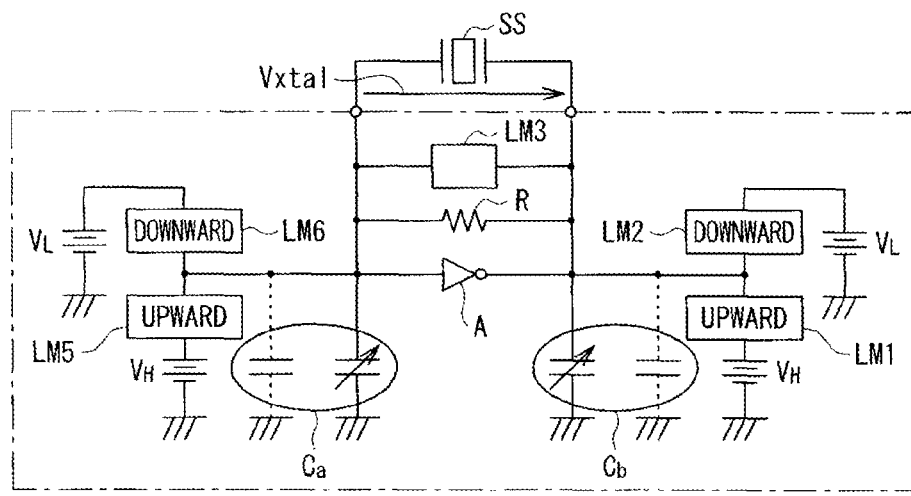
FIG. 15($a$) is a diagram showing an example of the configuration in which a differential limiter circuit is added, FIG. 15($b$) is a diagram showing an example of the configuration in which another differential limiter circuit is added, and FIG. 15($c$) is a diagram showing an example of the configuration in which the two differential limiter circuits are added.
Figure 15B:
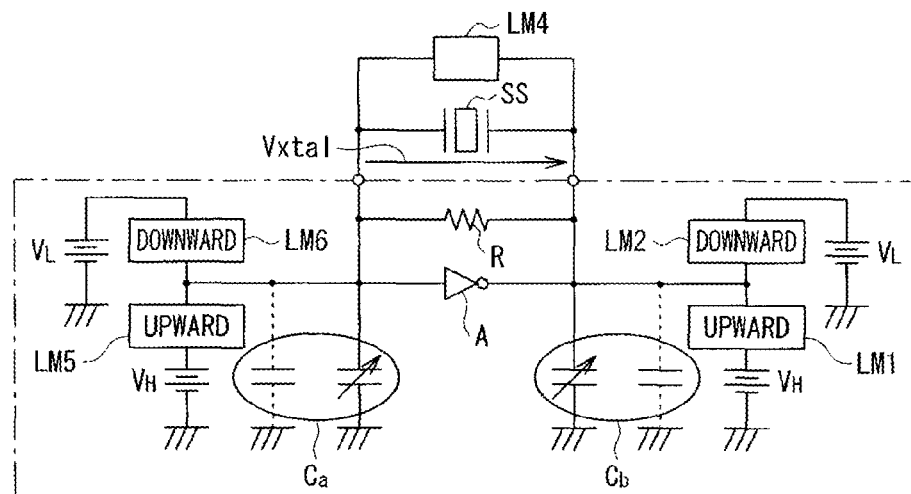
Figure 15C:
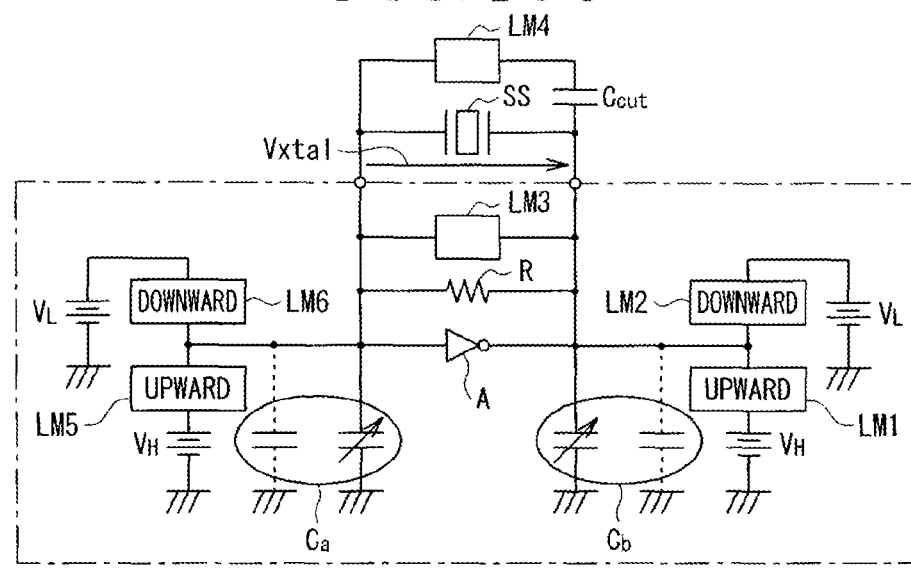
Figure 16:
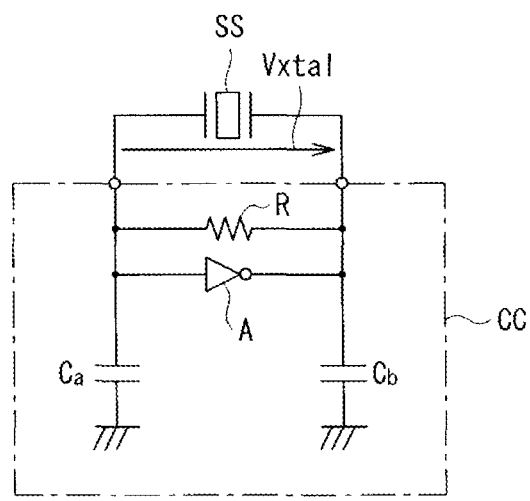
FIG. 16 is a diagram showing an example of the configuration of a general crystal oscillator.
Figure 17:
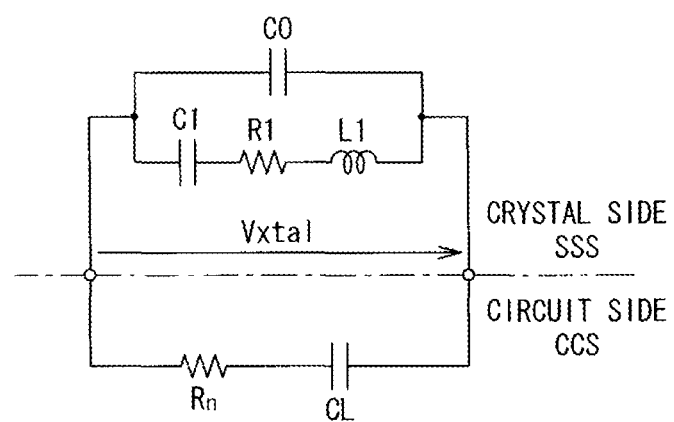
FIG. 17 is a diagram showing an equivalent circuit of the configuration in FIG. 16.
Figure 18:
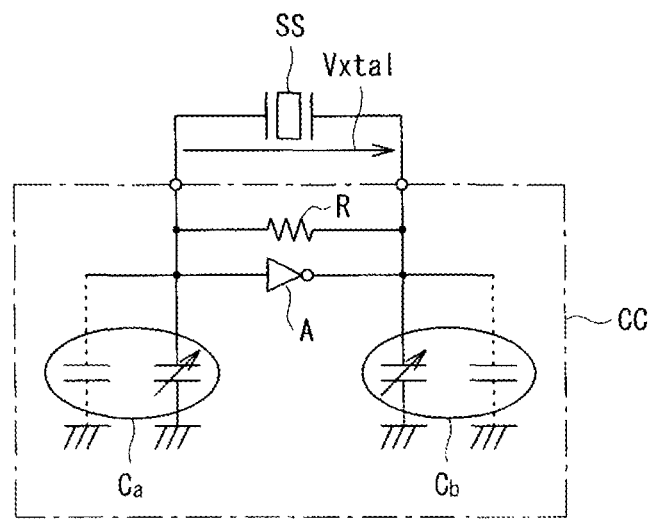
FIG. 18 is a diagram showing an example of the configuration of a frequency-controlled crystal oscillator.
Figure 19:
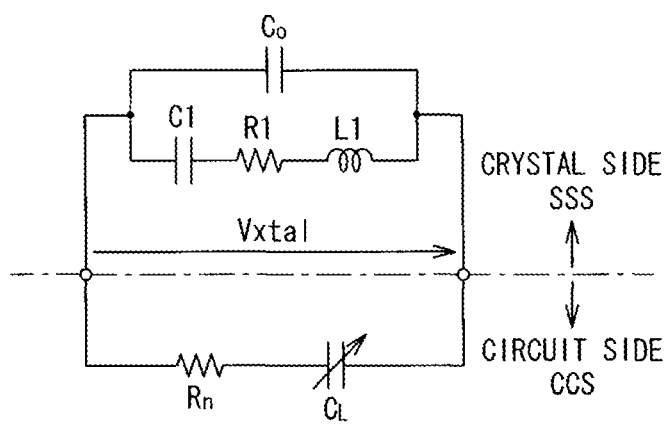
FIG. 19 is a diagram showing an equivalent circuit of the configuration in FIG. 18.
Figure 20:
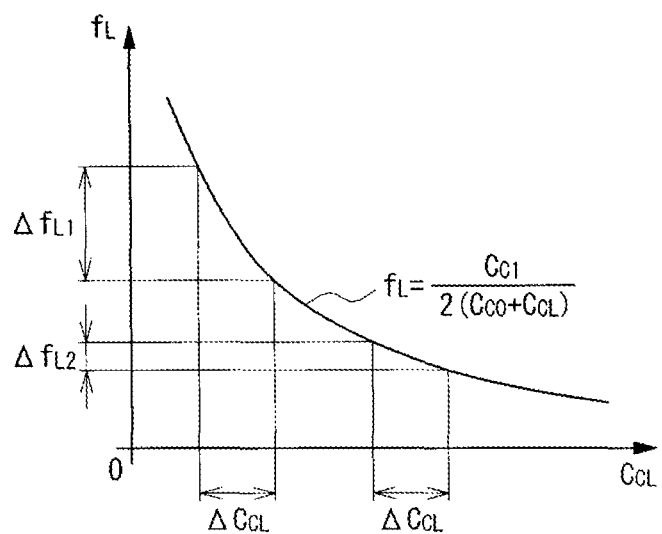
FIG. 20 is a graph showing a change in oscillation frequency with respect to an oscillator equivalent capacitance.
Figure 21:
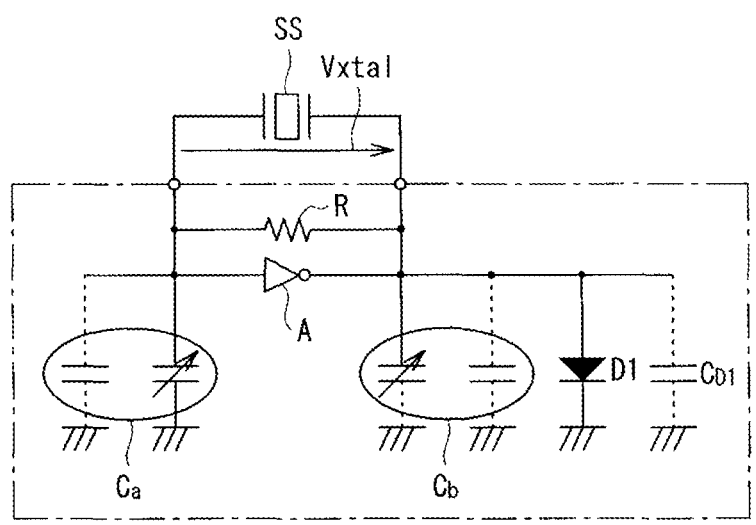
FIG. 21 is a diagram showing an example of a general method for keeping a crystal voltage amplitude down.

A limiter circuit may be added in parallel to the crystal resonator SS. More specifically, the differential limiter circuit LM3 as in FIG. 10 may be added, as shown in FIG. 15(a), and the differential limiter circuit LM4 as in FIG. 11(a) may be added, as shown in FIG. 15(b). Alternatively, the differential limiter circuits LM3 and LM4 as in FIG. 11(b) may be added, as shown in FIG. 15(c). The directions in which the differential limiter circuits LM3 and LM4 are connected are the same as in FIGS. 10, 11(a), and 11(b).

If a configuration with a plurality of limiter circuits is adopted, and bipolar transistors are manufactured by a CMOS process, it is preferable to manufacture only bipolar transistors of the same type in that it requires a smaller number of processes. More specifically, use of a combination of limiter circuits (FIGS. 9(d) and 9(c)) which both include an NPN-type bipolar transistor or use of a combination of limiter circuits (FIGS. 9(f) and 9(e)) which both include a PNP-type bipolar transistor as limiter circuits for upper and lower voltage limits is preferable in that it requires a smaller number of processes.

In the embodiments described above, a resistive element and a capacitive element are provided as a resistive component and a capacitive component. A parasitic resistance and a parasitic capacitance may be used instead. Even if a resistive component and a capacitive component are realized by a parasitic resistance and a parasitic capacitance without a resistive element and a capacitive element, satisfaction of the drive level needed for a crystal resonator and expansion of a variable frequency range can be achieved.

Alternatively, an oscillation circuit section for oscillating a crystal resonator and the limiter circuit(s) described above may be integrated into one and may be integrated on the same substrate. A crystal resonator may be further added and be integrated with the oscillation circuit section and the limiter circuit(s), and they may be integrated on the same substrate.

(Summary)

As has been described above, according to the present invention, inclusion of a circuit which is inductive and limits an oscillation amplitude as a load of a crystal resonator allows satisfaction of the drive level needed for the resonator and expansion of a variable frequency range.

INDUSTRIAL APPLICABILITY

The present invention can be used in an oscillator including an oscillation circuit for oscillating a resonator.

Description of Symbols

| | |
|---|---|
| 1, 2 | N-type MOS transistor |
| A | amplifier |
| Ca, Cb | load capacitive element |
| CC | oscillation circuit section |
| Ccut | capacitor |
| CL | oscillator equivalent capacitive component |
| Cx, Cx2 | capacitive element |
| D1 | diode |
| Is | current source |
| LM1, LM2, LM5, LM6 | limiter circuit |
| LM3, LM4 | differential limiter circuit |
| Rx, Rx2 | resistive element |
| SS | crystal resonator |

The invention claimed is:

1. An oscillator comprising:
an oscillation circuit for oscillating a resonator; and
a limiter circuit which is inductive and limits an oscillation amplitude, as a load of the resonator,
wherein the limiter circuit comprises:
an NPN bipolar transistor having an emitter connected to a terminal of the resonator and a collector to which a first predetermined voltage is supplied,
a resistive component having one terminal to which a second predetermined voltage is supplied and the other terminal connected to a base of the NPN bipolar transistor, and
a capacitive component provided between the emitter and the base of the NPN bipolar transistor.

2. An oscillator comprising:
an oscillation circuit for oscillating a resonator; and
a limiter circuit which is inductive and limits an oscillation amplitude, as a load of the resonator,
wherein the limiter circuit comprises:
an NPN bipolar transistor having a collector connected to a terminal of the resonator and an emitter to which a predetermined voltage is supplied,
a resistive component provided between the collector and a base of the NPN bipolar transistor, and
a capacitive component provided between the emitter and the base of the NPN bipolar transistor.

3. An oscillator comprising:
an oscillation circuit for oscillating a resonator; and
a limiter circuit which is inductive and limits an oscillation amplitude, as a load of the resonator,
wherein the limiter circuit comprises:
a PNP bipolar transistor having an emitter connected to the resonator and a collector to which a first predetermined voltage is supplied,
a resistive component having one end to which a second predetermined voltage is supplied and the other end connected to a base of the PNP bipolar transistor, and
a capacitive component provided between the emitter and the base of the PNP bipolar transistor.

4. An oscillator comprising:
an oscillation circuit for oscillating a resonator; and
a limiter circuit which is inductive and limits an oscillation amplitude, as a load of the resonator,
wherein the limiter circuit comprises:
a PNP bipolar transistor having a collector connected to the resonator and an emitter to which a predetermined voltage is supplied,
a resistive component provided between the collector and a base of the PNP bipolar transistor, and
a capacitive component provided between the emitter and the base of the PNP bipolar transistor.

5. An oscillator comprising:
an oscillation circuit for oscillating a resonator; and
a limiter circuit which is inductive and limits an oscillation amplitude, as a load of the resonator,
wherein the limiter circuit comprises:
a MOS transistor having a drain connected to the resonator and a source to which a predetermined voltage is supplied,
a resistive component provided between the drain and a gate of the MOS transistor, and
a capacitive component provided between the source and the gate of the MOS transistor.

6. The oscillator according to claim 5, wherein the MOS transistor is an N-type MOS transistor.

7. The oscillator according to claim 5, wherein the MOS transistor is a P-type MOS transistor.

8. An oscillator comprising:
an oscillation circuit for oscillating a resonator; and
a limiter circuit which is inductive and limits an oscillation amplitude, as a load of the resonator,
wherein the limiter circuit comprises:
a MOS transistor having a source connected to the resonator and a drain to which a first predetermined voltage is supplied,
a resistive component having one end to which a second predetermined voltage is supplied and the other end connected to a gate of the MOS transistor, and
a capacitive component provided between the source and the gate of the MOS transistor.

9. The oscillator according to claim 8, wherein the MOS transistor is an N-type MOS transistor.

10. The oscillator according to claim 8, wherein the MOS transistor is a P-type MOS transistor.

11. The oscillator according to any one of claims 1-5 and 8, wherein the limiter circuit is connected to at least one terminal of the resonator.

12. The oscillator according to any one of claims 1-5 and 8, wherein the limiter circuit is connected in parallel to the resonator.

* * * * *